(12) United States Patent
Huang et al.

(10) Patent No.: US 10,978,342 B2
(45) Date of Patent: Apr. 13, 2021

(54) INTERCONNECT WITH SELF-FORMING WRAP-ALL-AROUND BARRIER LAYER

(71) Applicant: International Business Machines Corporation, Armonk, NY (US)

(72) Inventors: Huai Huang, Saratoga, NY (US); Takeshi Nogami, Schenectady, NY (US); Alfred Grill, White Plains, NY (US); Benjamin D. Briggs, Waterford, NY (US); Nicholas A. Lanzillo, Troy, NY (US); Christian Lavoie, Pleasantville, NY (US); Devika Sil, Rensselaer, NY (US); Prasad Bhosale, Albany, NY (US); James Kelly, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/262,560

(22) Filed: Jan. 30, 2019

(65) Prior Publication Data
US 2020/0243383 A1    Jul. 30, 2020

(51) Int. Cl.
*H01L 21/4763* (2006.01)
*H01L 21/768* (2006.01)
(Continued)

(52) U.S. Cl.
CPC .. *H01L 21/76883* (2013.01); *H01L 21/76802* (2013.01); *H01L 21/76846* (2013.01); *H01L 21/76849* (2013.01); *H01L 21/76864* (2013.01); *H01L 23/5226* (2013.01); *H01L 23/5329* (2013.01); *H01L 23/53209* (2013.01); *H01L 23/53252* (2013.01); *H01L 23/53276* (2013.01)

(58) Field of Classification Search
CPC ......... H01L 21/76843; H01L 21/76877; H01L 23/53295; H01L 29/1606; H01L 21/76847; H01L 21/76849; H01L 21/76852
USPC ........ 257/622, 750, 751, 758; 468/622, 627, 468/637, 672
See application file for complete search history.

(56) References Cited

U.S. PATENT DOCUMENTS 8,358,008 B2    1/2013  Wada et al.
8,623,761 B2    1/2014  Bonilla et al.
(Continued)

FOREIGN PATENT DOCUMENTS

CN          105118821 A    12/2015

OTHER PUBLICATIONS

Kwak et al., "Near room-temperature synthesis of transfer-free graphene films," nature communications, 3:645 (Jan. 2012) (7 pages).
(Continued)

*Primary Examiner* — S. V. Clark
(74) *Attorney, Agent, or Firm* — James Nock; Michael J. Chang, LLC

(57) ABSTRACT

The present invention provides interconnects with self-forming wrap-all-around graphene barrier layer. In one aspect, a method of forming an interconnect structure is provided. The method includes: patterning at least one trench in a dielectric; forming an interconnect in the at least one trench embedded in the dielectric; and forming a wrap-all-around graphene barrier surrounding the interconnect. An interconnect structure having a wrap-all-around graphene barrier is also provided.

9 Claims, 9 Drawing Sheets

(51) Int. Cl.
     *H01L 23/522*     (2006.01)
     *H01L 23/532*     (2006.01)

(56) References Cited

U.S. PATENT DOCUMENTS

| | | |
|---|---|---|
| 8,895,433 B2 | 11/2014 | Bonilla et al. |
| 9,472,450 B2 | 10/2016 | Bonilla et al. |
| 2011/0303899 A1 | 12/2011 | Padhi et al. |
| 2013/0015581 A1* | 1/2013 | Wann ............... H01L 21/76847 257/751 |
| 2014/0106561 A1* | 4/2014 | Niyogi ................. C23C 14/042 438/643 |
| 2014/0145332 A1 | 5/2014 | Ryan et al. |
| 2015/0041981 A1* | 2/2015 | Bao ..................... H01L 23/4827 257/751 |
| 2017/0358486 A1 | 12/2017 | Ham et al. |
| 2018/0166333 A1 | 6/2018 | Yang et al. |
| 2018/0247722 A1* | 8/2018 | Yang ........................ H01B 1/02 |
| 2019/0157212 A1* | 5/2019 | Song ................ H01L 23/53209 |
| 2019/0259658 A1* | 8/2019 | Yang ................ H01L 23/53223 |
| 2020/0118924 A1* | 4/2020 | Yang ................ H01L 21/76802 |

OTHER PUBLICATIONS

Lo et al., "BEOL Compatible 2D Layered Materials as Ultra-Thin Diffusion Barriers for Cu Interconnect Technology," 2017 75th Annual Device Research Conference (DRC) (Jun. 2017) (2 pages).
Lo et al., "Large-Area, Single-Layer Molybdenum Disulfide Synthesized at BEOL Compatible Temperature as Cu Diffusion Barrier," IEEE Electron Device Letters, vol. 39, No. 6, pp. 873-876 (Jun. 2018).
English Translation of CN105118821A, Dec. 2, 2015, by Liu Feng et al. (7 pages).

* cited by examiner (following from FIG. 1)

(following from FIG. 5)

(following from FIG. 11)

INTERCONNECT WITH SELF-FORMING WRAP-ALL-AROUND BARRIER LAYER

FIELD OF THE INVENTION

The present invention relates to interconnect technology, and more particularly, to interconnects with self-forming wrap-all-around graphene barrier layer.

BACKGROUND OF THE INVENTION

Traditionally, copper (Cu) has been used as the main interconnect conducting metal. However, as device dimensions shrink, the resistance of Cu-based interconnects becomes very high.

Further, Cu interconnects require the use of a barrier layer to prevent diffusion of the Cu into the surrounding dielectric. Use of conventional barrier materials like titanium nitride (TiN), tantalum nitride (TaN), however, unduly limits the amount of Cu in the interconnect, thereby further increasing the resistance.

Cobalt (Co) or other alternative metals can be used to replace Cu as the main interconnect conducting metal due to thinner or no liner requirements and shorter mean free path. However, metals like Co can still diffuse into the surrounding dielectric. Thus, a barrier is needed for reliability time-dependent dielectric breakdown (TDDB) and this barrier needs to be very thin to achieve low line resistance. For performance, surface scattering needs improvement to reduce line resistance.

Therefore, improved interconnect designs and techniques for the fabrication thereof would be desirable.

SUMMARY OF THE INVENTION

The present invention provides interconnects with self-forming wrap-all-around graphene barrier layer. In one aspect of the invention, a method of forming an interconnect structure is provided. The method includes: patterning at least one trench in a dielectric; forming an interconnect in the at least one trench embedded in the dielectric; and forming a wrap-all-around graphene barrier surrounding the interconnect.

For instance, a graphene layer can be deposited on top of the interconnect. The interconnect and the graphene layer can be annealed under conditions sufficient to diffuse carbon atoms from the graphene layer to form a buried graphene layer at an interface between the dielectric and the interconnect, wherein the graphene layer and the buried graphene layer form the wrap-all-around graphene barrier layer surrounding the interconnect. Alternatively, a graphene layer on top of the interconnect and a buried graphene layer at an interface between the dielectric and the interconnect can be formed concurrently, wherein the graphene layer and the buried graphene layer form the wrap-all-around graphene barrier layer surrounding the interconnect.

Also, a metal liner can be deposited into and lining the at least one trench; a conformal carbon layer can be deposited onto the metal liner; a fill metal can be deposited into the at least one trench over the metal liner, wherein the metal liner and the fill metal form the interconnect in the at least one trench; a second dielectric can be deposited over the interconnect; and the interconnect and the conformal carbon layer can be annealed under conditions sufficient to diffuse carbon atoms from the conformal carbon layer to form graphene layers at an interface between the dielectric and the interconnect, and at an interface between the second dielectric and the interconnect, wherein the graphene layers form the wrap-all-around graphene barrier layer surrounding the interconnect.

Further, a metal liner can be deposited into and lining the at least one trench; graphene can be formed concurrently above and below the metal liner; a fill metal can be deposited into the at least one trench over the metal liner, wherein the metal liner and the fill metal form the interconnect in the at least one trench; a second dielectric can be deposited over the interconnect; and the interconnect and the graphene can be annealed under conditions sufficient to diffuse carbon atoms from the graphene to form a graphene layer at an interface between the second dielectric and the interconnect, wherein the graphene below the metal liner and the graphene layer form the wrap-all-around graphene barrier layer surrounding the interconnect.

Yet further, a metal liner can be deposited into and lining the at least one trench; graphene can be formed concurrently above and below the metal liner; the graphene above metal liner can be removed; a fill metal can be deposited into the at least one trench over the metal liner, wherein the metal liner and the fill metal form the interconnect in the at least one trench; and a graphene layer can be deposited on top of the interconnect, wherein the graphene below the metal liner and the graphene layer form the wrap-all-around graphene barrier layer surrounding the interconnect.

In another aspect of the invention, an interconnect structure is provided. The interconnect structure includes: at least one interconnect embedded in a dielectric; and a wrap-all-around graphene barrier surrounding the interconnect.

A more complete understanding of the present invention, as well as further features and advantages of the present invention, will be obtained by reference to the following detailed description and drawings.

DETAILED DESCRIPTION OF PREFERRED EMBODIMENTS

Provided herein are (e.g., cobalt (Co), ruthenium (Ru), etc.) interconnect structures with self-forming, wrap-all-around graphene barrier layer that surrounds the interconnect and techniques for the fabrication thereof. The interconnects are completely wrapped with a thin graphene layer. This graphene layer serves as a metal barrier and improves the interface scattering and resistance.

Several different process flows are provided herein to form the present interconnects with a wrap-all-around graphene barrier layer. For instance, in a first exemplary embodiment described by way of reference to FIGS. 1-4, carbon deposited on top of the interconnect is diffused to all buried metal-dielectric interfaces to form a thin graphene barrier layer that completely wraps around the interconnect.

Figure 1:
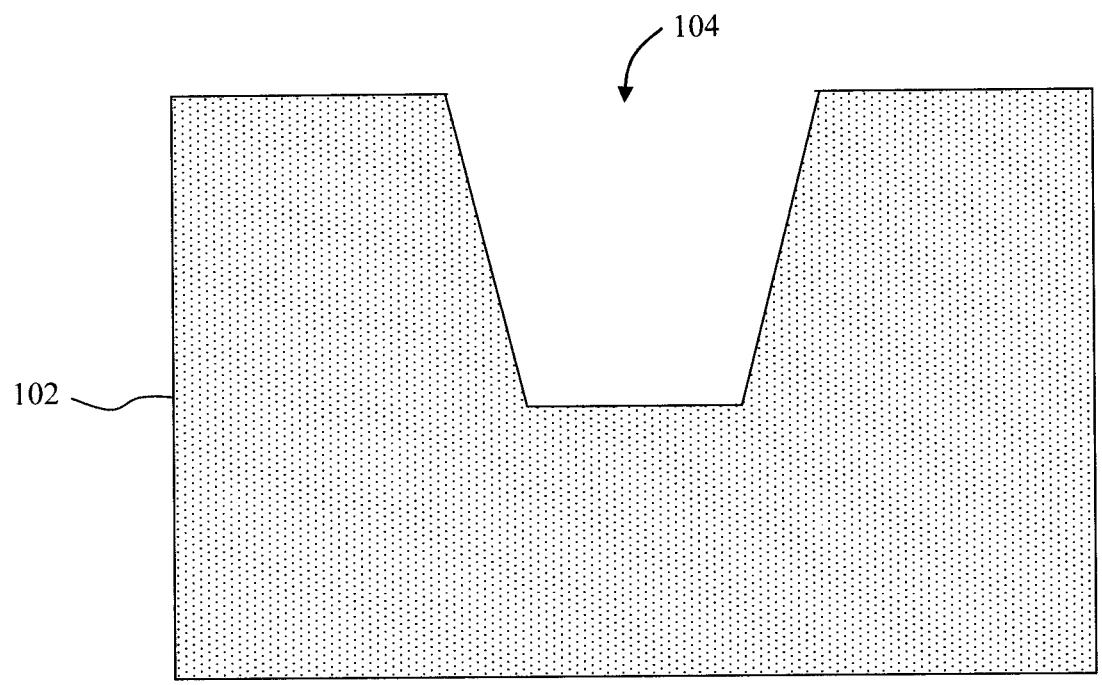
FIG. 1 is a cross-sectional diagram illustrating at least one trench having been patterned in a dielectric according to an embodiment of the present invention.
Figure 2:
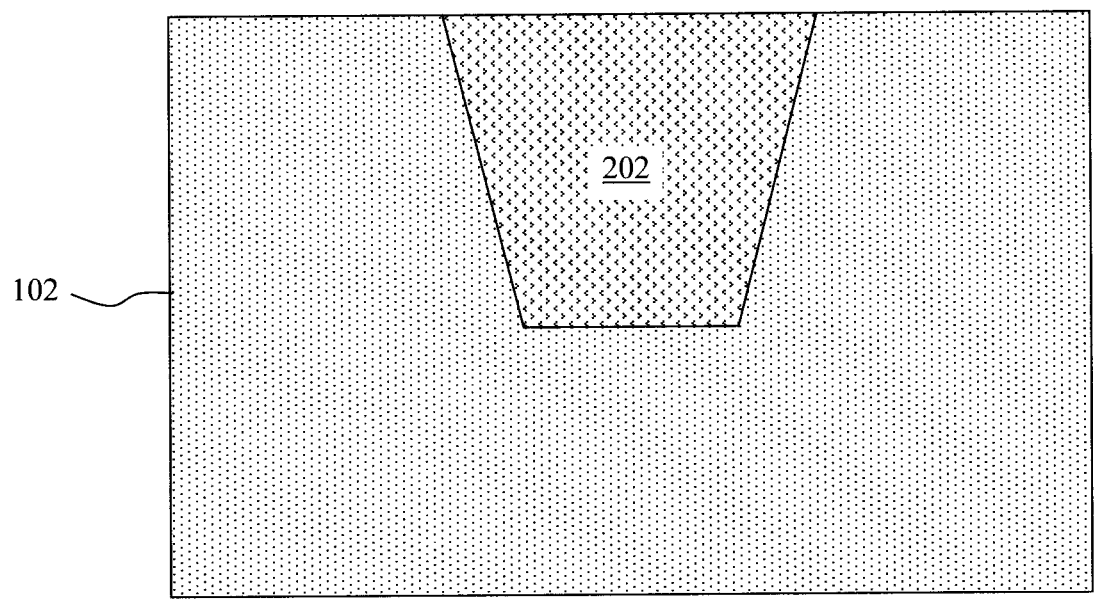
FIG. 2 is a cross-sectional diagram illustrating a metal having been deposited into and filling the trench, followed by chemical mechanical polishing (CMP), to form an interconnect in the trench according to an embodiment of the present invention.

Namely, as shown in FIG. 1, the process begins with a dielectric 102. Suitable dielectric materials include, but are not limited to, oxide materials such as silicon oxide (SiOx) and/or organosilicate glass (SiCOH) and/or ultralow-κ interlayer dielectric (ULK-ILD) materials, e.g., having a dielectric constant K of less than 2.7. By comparison, silicon dioxide ($SiO_2$) has a dielectric constant K value of 3.9. Suitable ultralow-κ dielectric materials include, but are not limited to, porous organosilicate glass (pSiCOH).

A damascene process is then employed to form a metal interconnect in the dielectric 102. Generally, a damascene process involves pattering a feature(s) (e.g., a trench, via, etc.) in the dielectric 102, filling the feature(s) with a conductive material (e.g., a metal such as Co, Ru, etc.) and then polishing the deposited metal to remove the overburden using, e.g., a process such as chemical-mechanical polishing (CMP). Namely, as shown in FIG. 1, at least one trench 104 is patterned in the dielectric 102. Standard lithography and etching techniques can be used to pattern the trench 104 in the dielectric 102. A directional (anisotropic) etching process such as reactive ion etching (RIE) can be used for the trench etch.

As shown in FIG. 1, the trench 104 extends partway through the dielectric 102. That way, when the metal interconnect is formed in the trench 104 dielectric 102 will be present along the bottom and sidewalls of the interconnect.

A metal is then deposited into and filling the trench 104, followed by a polishing process such as CMP to remove the overburden. The result is the formation of a metal interconnect 202 in trench 104. See FIG. 2. Suitable metals for interconnect 202 include, but are not limited to, Co and/or Ru. The metal can be deposited into the trench 104 using a process such as physical vapor deposition (PVD), chemical vapor deposition (CVD), plating, evaporation, sputtering, etc.

A graphene layer 302 is then deposited on the top surfaces of the dielectric 102/interconnect 202. See FIG. 3. See, for example, U.S. Patent Application Publication Number 2011/0303899 by Padhi et al., entitled "Graphene Deposition" (hereinafter "U.S. Patent Application Publication Number 2011/0303899"). As described in U.S. Patent Application Publication Number 2011/0303899, graphene can be grown on a metallic layer (e.g., Co) using a CVD-based process and a carbon precursor such as acetylene.

The interconnect 202/graphene layer 302 are then annealed under conditions sufficient to diffuse carbon atoms from the graphene layer 302, through the interconnect 202, to form a buried graphene layer 402 at the interface between dielectric 102 and interconnect 202. See FIG. 4. According to an exemplary embodiment, graphene layers 302 and 402 each includes from about 1 monolayer (i.e., a single monolayer) to about 5 monolayers of graphene. A graphene 'monolayer' is a one atom thick layer of graphene.

Advantageously, the graphene layer 402 acts as a metal barrier layer between the interconnect 202 and the dielectric 102, and improves interface scattering and resistance. As described, for example, in Kwak et al., "Near room-temperature synthesis of transfer-free graphene films," nature communications, 3:645 (January 2012) (7 pages) (hereinafter "Kwak"), the contents of which are incorporated by reference as if fully set forth herein, the carbon from a solid carbon source (in this case carbon layer 302) can be effectively diffused through a metal (in this case interconnect 202) and crystallize as graphene at the metal-substrate interface, and also form a layer of graphene on top of the metal. Notably, as described in Kwak this process can be carried out at temperatures of less than or equal to about 260° C. As such, these low temperatures will prevent damaging structures such as the dielectric 102 (which can occur at temperatures exceeding 600° C.).

Namely, according to an exemplary embodiment, the annealing conditions include, but are not limited to, a temperature of less than about 600° C., e.g., from about 25° C. to about 260° C. and ranges therebetween, and a duration of from about 1 minute to about 30 minutes and ranges therebetween. Further, as will be described in detail below, the present techniques can also be employed to form a graphene barrier both above and below the metal at the same time, thereby combining the carbon deposition and diffusion into a single step.

Figure 4:
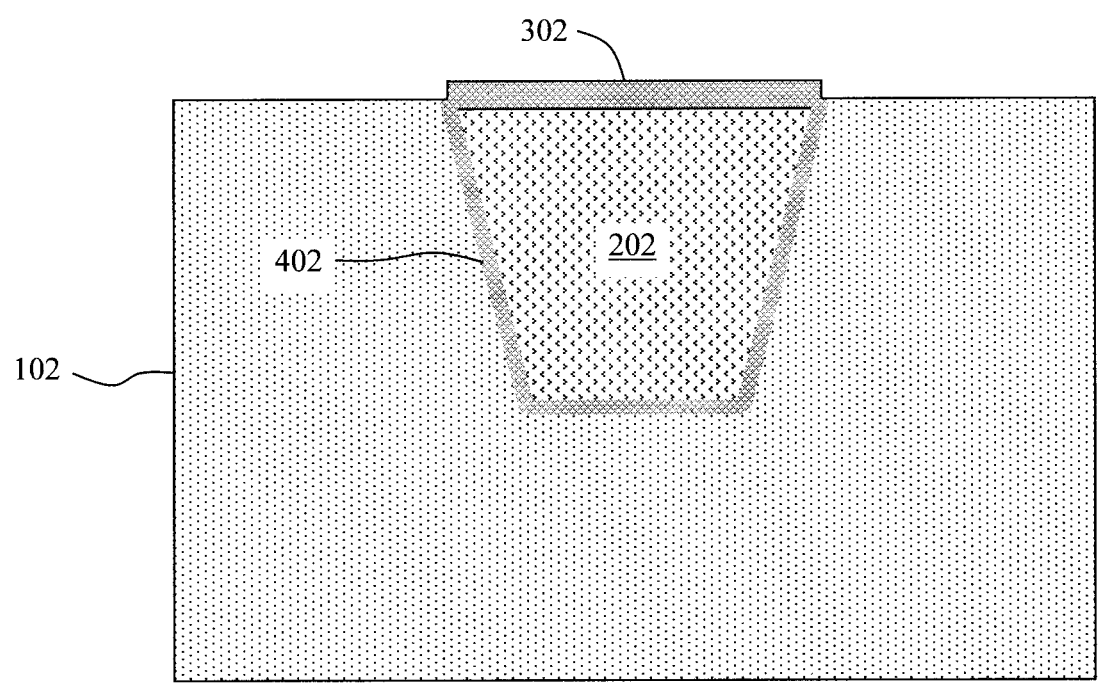
FIG. 4 is a cross-sectional diagram illustrating the interconnect/graphene layer having been annealed under conditions sufficient to diffuse carbon atoms from the graphene layer to form a buried graphene layer at the interface between the dielectric and the interconnect according to an embodiment of the present invention.

As shown in FIG. 4, the result is a (e.g., Co and/or Ru) interconnect 202 embedded in the dielectric 102 having a wrap-all-around graphene barrier layer (i.e., graphene layers 302 and 402). As provided above, this wrap-all-around graphene layer acts as a barrier to prevent diffusion of metal ions from the interconnect 202 into the dielectric 102, and also improves interface scattering and resistance.

As highlighted above, an alternate process can instead be employed to form the wrap-all-around graphene barrier layer (i.e., graphene layers 302 and 402) both above and below the interconnect 202 concurrently. For instance, as described, for example, in Lo et al., "BEOL Compatible 2D Layered Materials as Ultra-Thin Diffusion Barriers for Cu Interconnect Technology," 2017 $75^{th}$ Annual Device Research Conference (DRC) (June 2017) (2 pages) (hereinafter "Lo"), the contents of which are incorporated by reference as if fully set forth herein, direct graphene growth by plasma-enhanced chemical vapor deposition (PECVD) on a metal layer can be used to form graphene layers both on top of the metal layer and below the metal layer at the metal-dielectric interface. Advantageously, as described in Lo, this process can be carried out at a temperature of 400° C.

Figure 3:
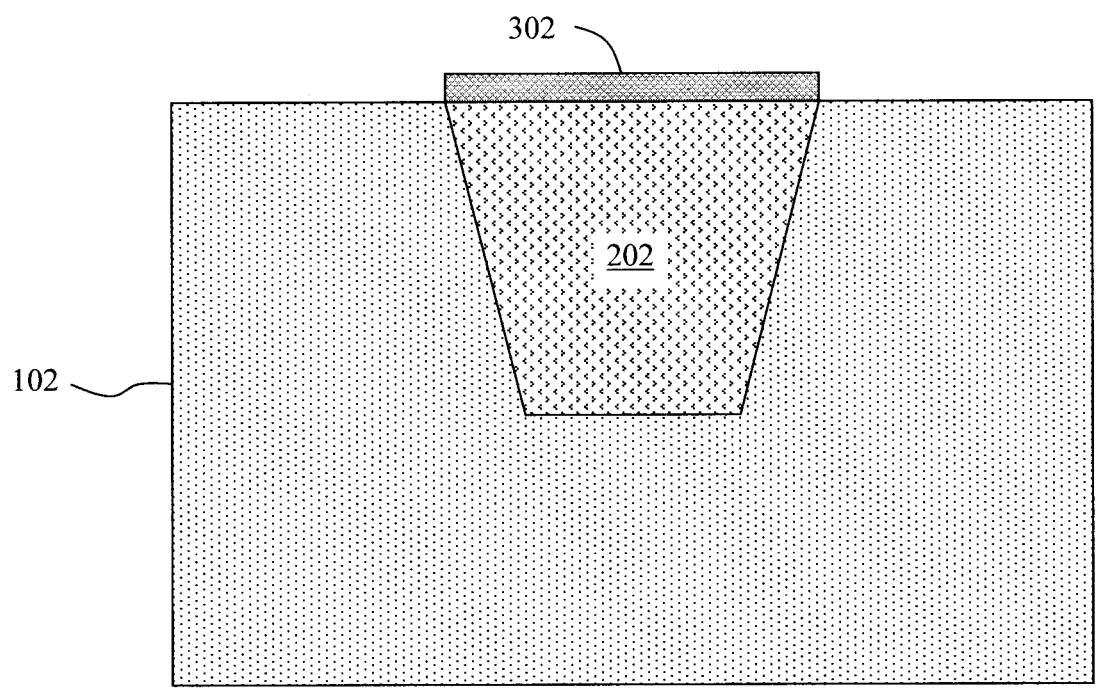
FIG. 3 is a cross-sectional diagram illustrating a graphene layer having been deposited on the top surfaces of the dielectric/interconnect according to an embodiment of the present invention.

Thus, according to an alternative embodiment, graphene is grown directly on the interconnect 202, using a process such as PECVD, to concurrently form i) graphene layer 402 at the dielectric 102/interconnect 202 interface and ii) graphene layer 302 on top of the interconnect 202. The result is the same as that depicted in FIG. 4, namely a (e.g., Co and/or Ru) interconnect 202 embedded in the dielectric 102 having a wrap-all-around graphene barrier layer (i.e., graphene layers 302 and 402). In this case, the intermediate step shown in FIG. 3 is skipped since the graphene growth occurs both above and below the interconnect 202 at the same step.

In another exemplary embodiment, only a thin (e.g., Co and/or Ru) metal liner is initially deposited prior to growing the carbon layer. That way, the carbon layer is placed in closer proximity to the metal liner-dielectric interface. See, for example, FIGS. 5-10. This alternative process flow begins in the same manner as described in accordance with the description of FIG. 1 above, with the patterning of the at least one trench 104 in the dielectric 102. Accordingly, what is shown in FIG. 5 follows from FIG. 1, and like structures are numbered alike in the drawings.

Figure 5:
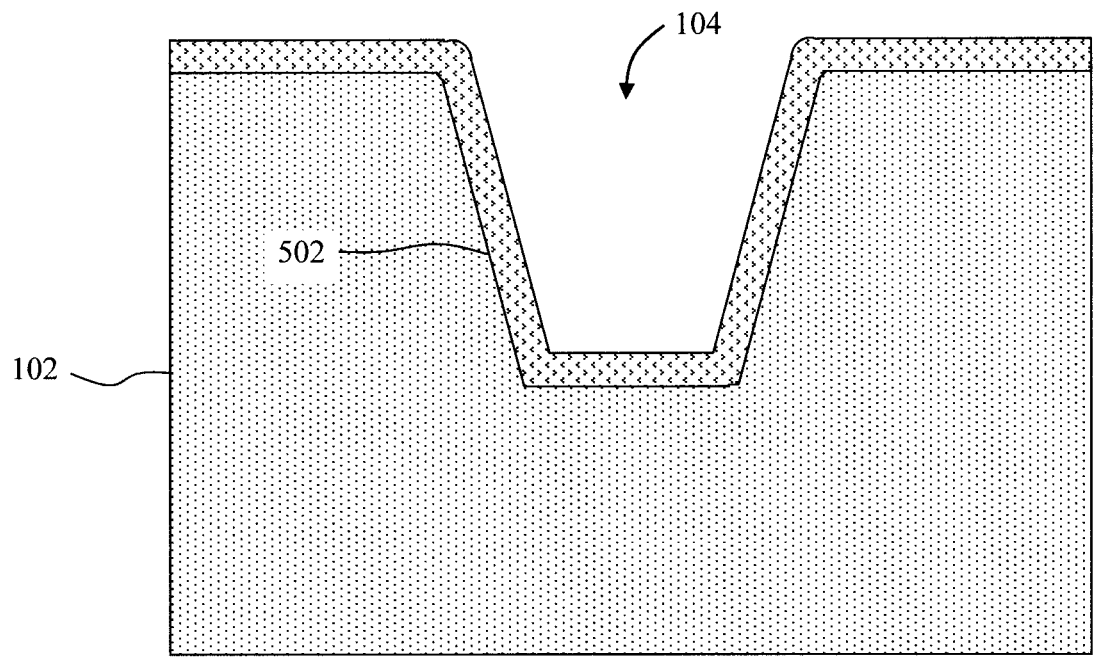
FIG. 5 is a cross-sectional diagram which follows from FIG. 1 illustrating, according to an alternative embodiment, a conformal metal liner having been deposited into and lining the trench according to an embodiment of the present invention.
Figure 6:
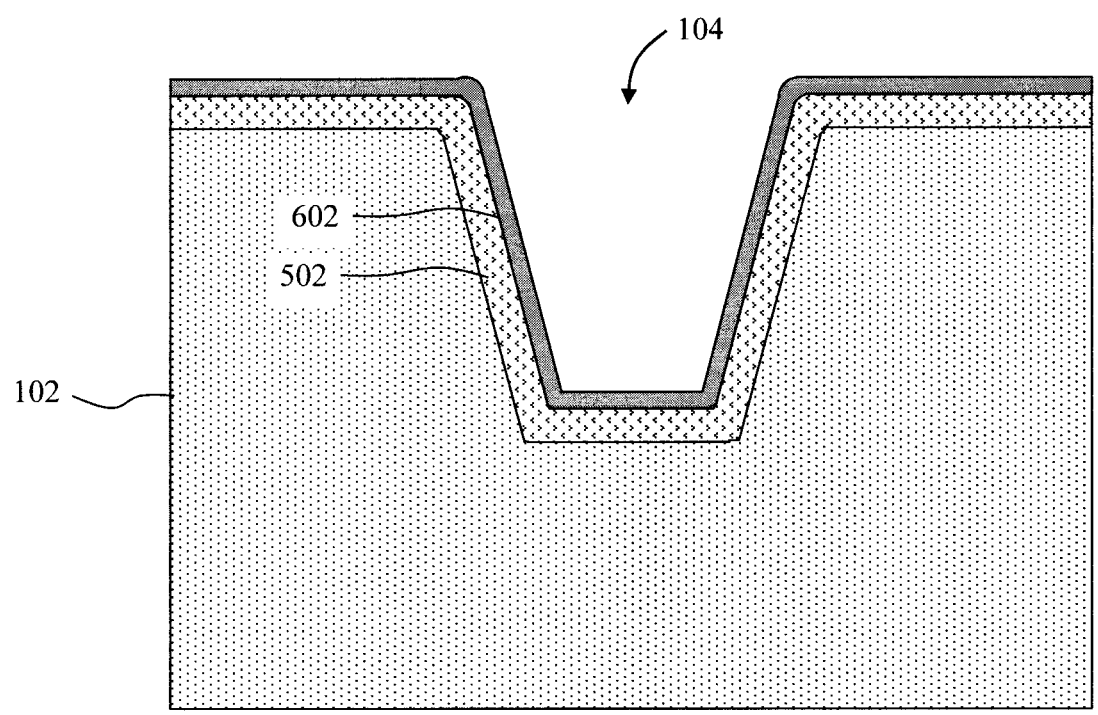
FIG. 6 is a cross-sectional diagram illustrating a conformal carbon layer having been deposited onto the metal liner according to an embodiment of the present invention.
Figure 7:
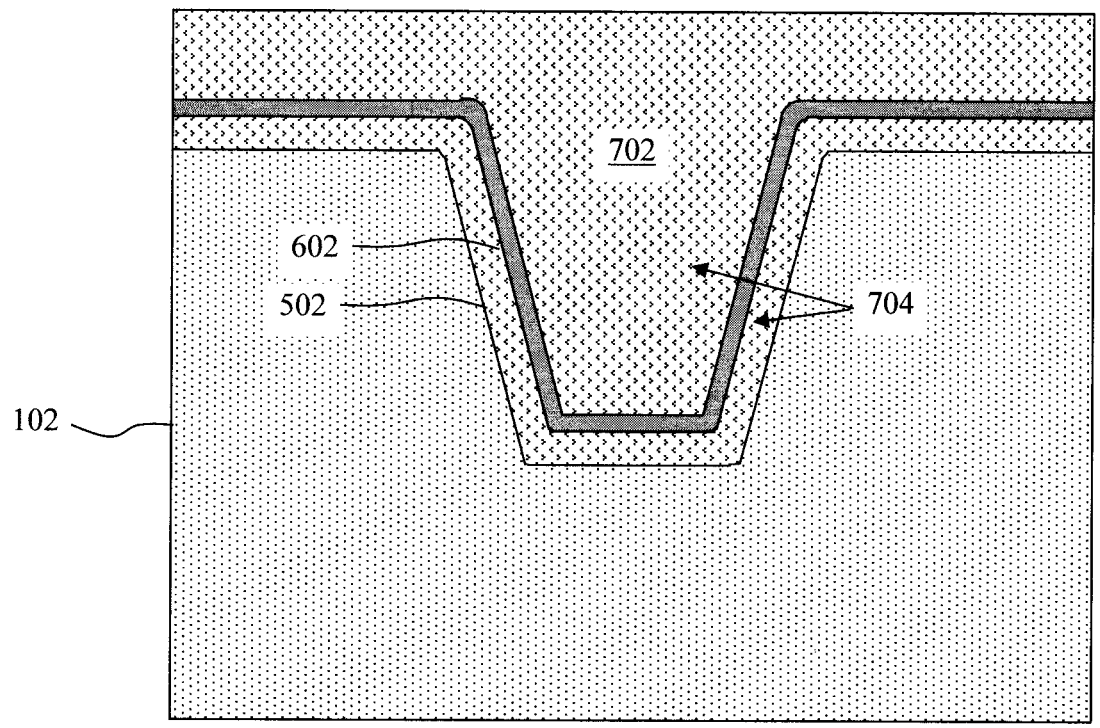
FIG. 7 is a cross-sectional diagram illustrating a fill metal having been deposited over the carbon layer and filling the trench to form an interconnect in the trench according to an embodiment of the present invention.

Referring to FIG. 5, a conformal metal liner 502 is then deposited into and lining the trench 104. Suitable metals for liner 502 include, but are not limited to, Co and/or Ru, which can be deposited into trench 104 using a process such as PVD, CVD, plating, evaporation, sputtering, etc. According to an exemplary embodiment, metal liner 502 is formed having a thickness of from about 5 nanometers (nm) to about 20 nm and ranges therebetween. As will be described in detail below, a fill metal (e.g., also Co and/or Ru) will later be deposited over the metal liner 502, filling the trench 104, to form the interconnect. According to an exemplary embodiment, the same metal as metal liner 502 will be used to fill the trench 104, e.g., both the fill metal and metal liner 502 are Co or Ru. However, this is not a requirement, and embodiments are contemplated herein where the metal liner 502 and the fill metal include different metals and/or different combinations of metals. For instance, to use an illustrative, non-limiting example, the metal liner 502 can be formed from Co, while the fill metal is Ru, and vice versa.

A conformal carbon layer 602 is then deposited onto the metal liner 502. See FIG. 6. According to an exemplary embodiment, carbon layer 602 includes amorphous carbon. However, embodiments are also contemplated herein where carbon layer 302 includes carbon in other forms including, but not limited to, crystalline graphene.

A fill metal 702 is then deposited over the carbon layer 602 and filling the trench 104. See FIG. 7. Along with metal liner 502, this fill metal 702 forms an interconnect 704 embedded in the dielectric 102. The fill metal 702 can be deposited using a process such as PVD, CVD, plating, evaporation, sputtering, etc. As provided above, the same metal as metal liner 502 can be used for the fill metal 702, e.g., both metal liner 502 and fill metal 702 are Co or Ru. However, this is not a requirement, and embodiments are contemplated herein where the metal liner 502 and the fill metal 702 are different metals and/or different combinations of metals. For instance, by way of example only, the metal liner 502 can be formed from Co, while the fill metal 702 is Ru, and vice versa.

Figure 8:
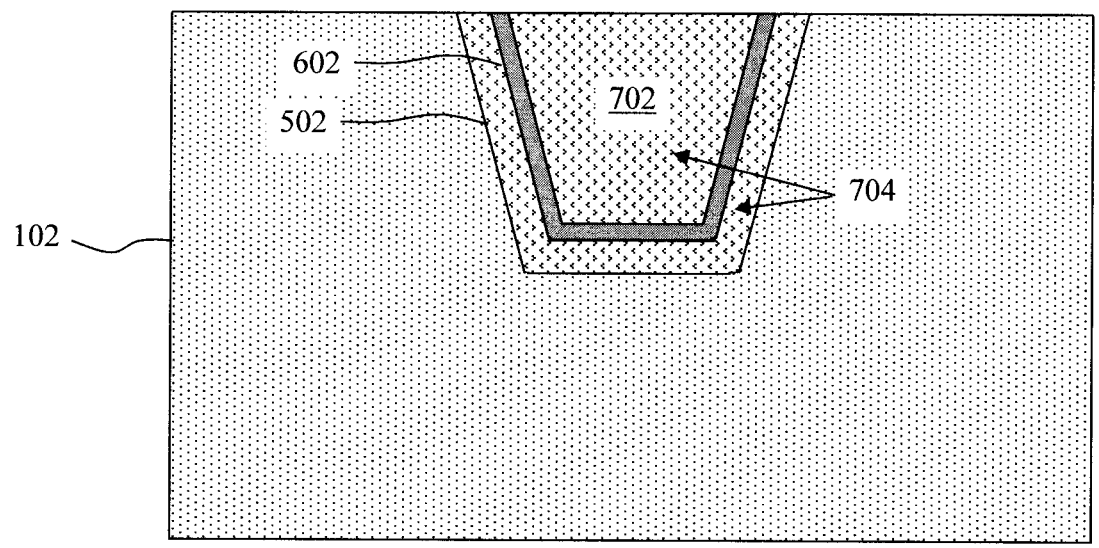
FIG. 8 is a cross-sectional diagram illustrating the fill metal having been polished to remove the overburden according to an embodiment of the present invention.

The fill metal 702 is then polished using a process such as CMP to remove the overburden. See FIG. 8. As shown in FIG. 8, this polishing step also serves to remove the metal liner 502 and carbon layer 602 from the top surface of dielectric 102, providing a flat, planar surface for the deposition of a second dielectric.

Figure 9:
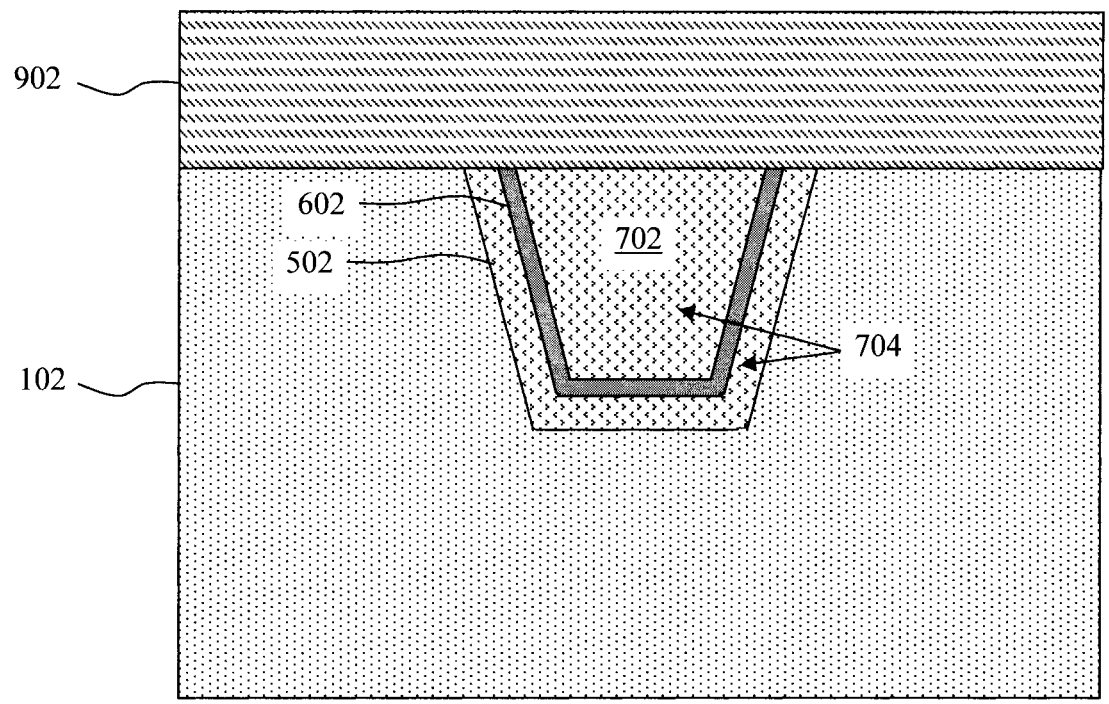
FIG. 9 is a cross-sectional diagram illustrating a second dielectric having been deposited onto the dielectric covering the carbon layer/interconnect according to an embodiment of the present invention.

Namely, as shown in FIG. 9, a second dielectric 902 (where dielectric 102 is the first dielectric) is deposited onto the dielectric 102 covering the carbon layer 602/interconnect 704. Suitable dielectrics 902 include, but are not limited to, oxide materials such as SiOx and/or SiCOH and/or ultralow-κ interlayer dielectric materials such as pSiCOH. The placement of (second) dielectric 902 provides an interface at the top of the interconnect 704 for diffusion of carbon from carbon layer 602 to form a graphene barrier on the top of the interconnect 704.

Namely, the interconnect 704 and carbon layer 602 are then annealed under conditions sufficient to diffuse carbon from the carbon layer 602, through the metal liner 502/metal fill 702, to form graphene layer 1002 at i) the interface between interconnect 704 and dielectric 102 and ii) at the interface between interconnect 704 and dielectric 902. See FIG. 10. As described above, and in Kwak, a low-temperature anneal can be used to diffuse the carbon from a solid carbon source (in this case carbon layer 602) through a metal (in this case metal liner 502/metal fill 702) and crystallize as graphene (in this case graphene layer 1002) at the metal-substrate interfaces (in this case the metal liner 502-dielectric 102/metal fill 702-dielectric 902 interfaces). If formed from the same material (see above), the metal liner 502/metal fill 702 components of interconnect 704 would no longer be distinct from one another. As such, dotted lines are used in FIG. 10 to distinguish the metal liner 502 from the metal fill 702. However, as provided above, embodiments are also contemplated herein where the metal liner 502/metal fill 702 have different compositions.

Figure 10:
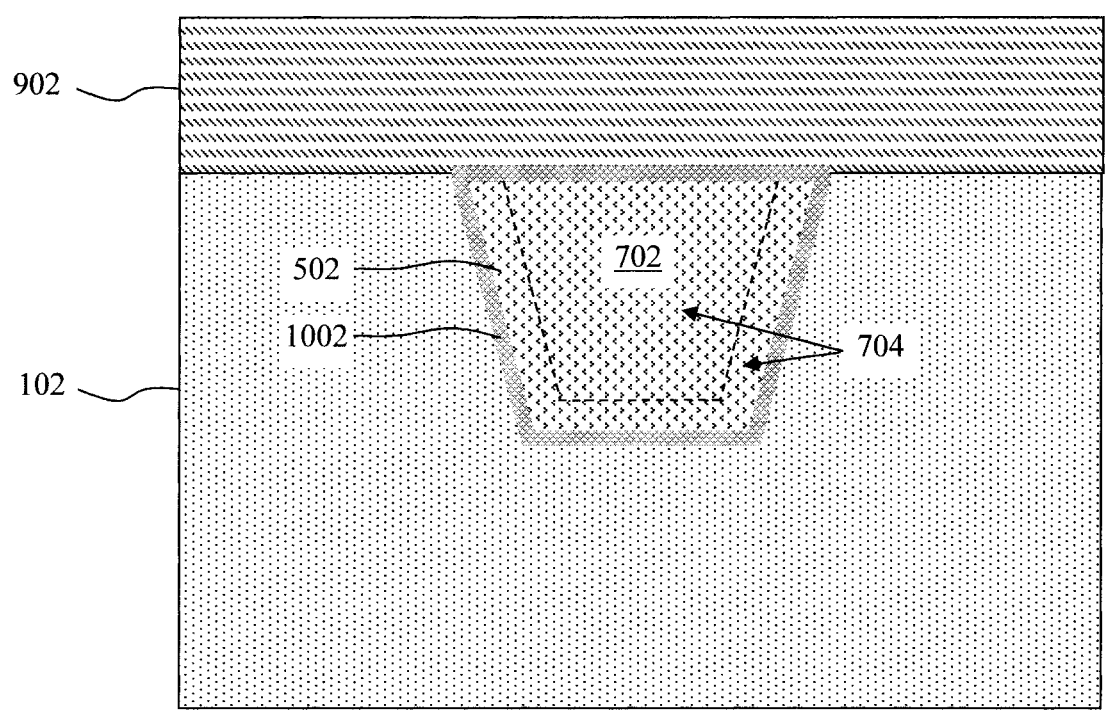
FIG. 10 is a cross-sectional diagram illustrating the interconnect and carbon layer having been annealed under conditions sufficient to diffuse carbon from the carbon layer to form a graphene layer at the interface between the interconnect and the dielectric, and at the interface between the interconnect and the second dielectric according to an embodiment of the present invention.

As shown in FIG. 10, the result is a (e.g., Co and/or Ru) interconnect 704 embedded in dielectrics 102 and 902. A wrap-all-around graphene barrier layer (i.e., graphene layer 1002) surrounds the interconnect.

According to an exemplary embodiment, the graphene layer 1002 includes from about 1 monolayer (i.e., a single monolayer) to about 5 monolayers of graphene. By way of example only, the annealing conditions include, but are not limited to, a temperature of less than about 600° C., e.g., from about 25° C. to about 260° C. and ranges therebetween, and a duration of from about 1 minute to about 30 minutes and ranges therebetween.

Figure 11:
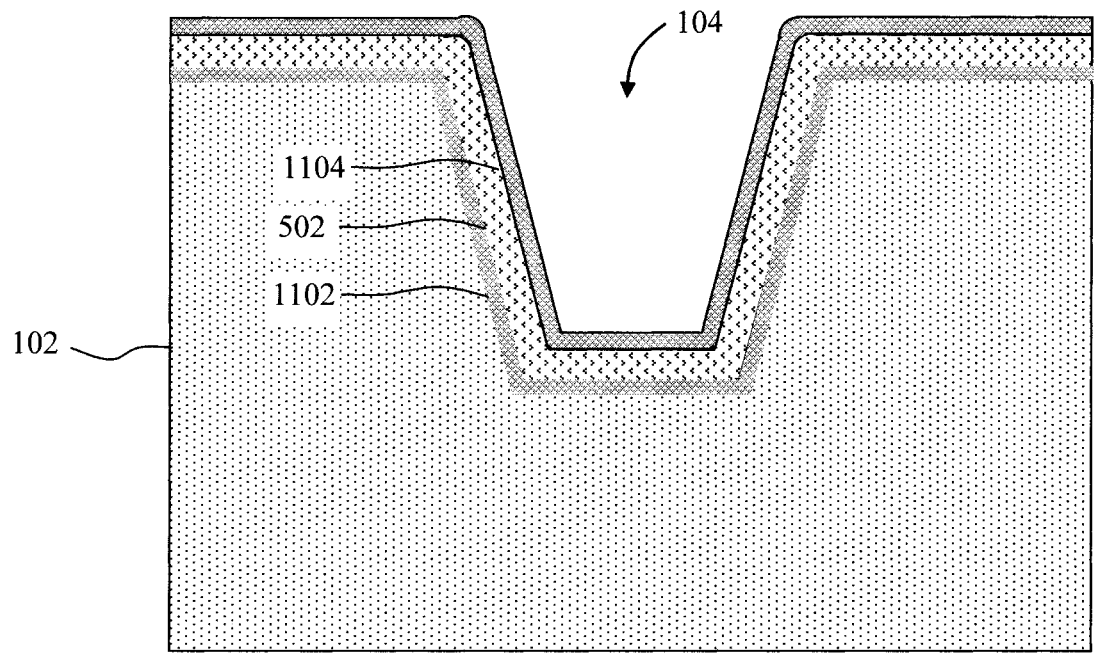
FIG. 11 is a cross-sectional diagram which follows from FIG. 5 illustrating, according to an alternative embodiment, graphene having been grown directly on the metal liner to concurrently form graphene layers at the dielectric/metal liner interface, and on top of the metal liner according to an embodiment of the present invention.

Alternatively, the above-described one-step graphene growth process both above and below the metal liner 502 can be employed. See, for example, FIGS. 11-13. This alternative process flow begins in the same manner as described above with the patterning of at least one trench 104 in the dielectric 102, and the deposition of the conformal metal liner 502 into and lining the trench 104. See FIG. 5. Accordingly, what is shown in FIG. 11 follows from FIG. 5, and like structures are numbered alike in the drawings.

In this case, however, graphene is grown directly on the metal liner 502, using a process such as PECVD, to concurrently form i) graphene layer 1102 at the dielectric 102/metal liner 502 interface and ii) graphene layer 1104 on top of metal liner 502. See FIG. 11. For instance, as described above, and in Lo, direct graphene growth by PECVD on a metal layer can be used to form graphene layers both on top of the metal layer and below the metal layer at the metal-dielectric interface.

A fill metal 1202 is then deposited (e.g., using PVD, CVD, plating, evaporation, sputtering, etc.) over the graphene layer 1104 and filling the trench 104, followed by polishing process such as CMP to remove the overburden (which also serves to remove the metal liner 502 and graphene layers 1102 and 1104 from the top surface of dielectric 102, providing a flat, planar surface for the deposition of a second dielectric). As provided above, the same metal as metal liner 502 can be used for the fill metal 1202, e.g., both metal liner 502 and fill metal 1202 are Co or Ru. However, this is not a requirement, and embodiments are contemplated herein where the metal liner 502 and the fill metal 1202 are different metals and/or different combinations of metals. For instance, by way of example only, the metal liner 502 can be formed from Co, while the fill metal 1202 is Ru, and vice versa. Along with metal liner 502, this fill metal 1202 forms an interconnect 1204 embedded in the dielectric 102.

In the same manner as described above, a second dielectric 1206 (where dielectric 102 is the first dielectric) is deposited onto the dielectric 102 covering the graphene layers 1102 and 1104/interconnect 1204. As provided above, suitable dielectrics 1206 include, but are not limited to, oxide materials such as SiOx and/or SiCOH and/or ultralow-κ interlayer dielectric materials such as pSiCOH. The placement of (second) dielectric 1206 provides an interface at the top of the interconnect 1204 for diffusion of carbon from graphene layers 1102 and 1104 to form a graphene barrier on the top of the interconnect 1204.

The interconnect 1204 and graphene layers 1102 and 1104 are then annealed under conditions sufficient to diffuse carbon from the graphene layers 1102 and 1104, through the metal liner 502/metal fill 1202, to form graphene layer 1302 at the interface between interconnect 1204 and dielectric 1206. See FIG. 13. As described above, and in Kwak, a low-temperature anneal can be used to diffuse the carbon from a solid carbon source (in this case graphene layers 1102 and 1104) through a metal (in this case metal liner 502/metal fill 1202) and crystallize as graphene (in this case graphene layer 1302) at the metal-substrate interfaces (in this case the metal fill 1202-dielectric 1206 interface). If formed from the same material (see above), the metal liner 502/metal fill 1202 components of interconnect 1204 would no longer be distinct from one another. As such, dotted lines are used in FIG. 13 to distinguish the metal liner 502 from the metal fill 1202. However, as provided above, embodiments are also contemplated herein where the metal liner 502/metal fill 1202 have different compositions.

Figure 13:
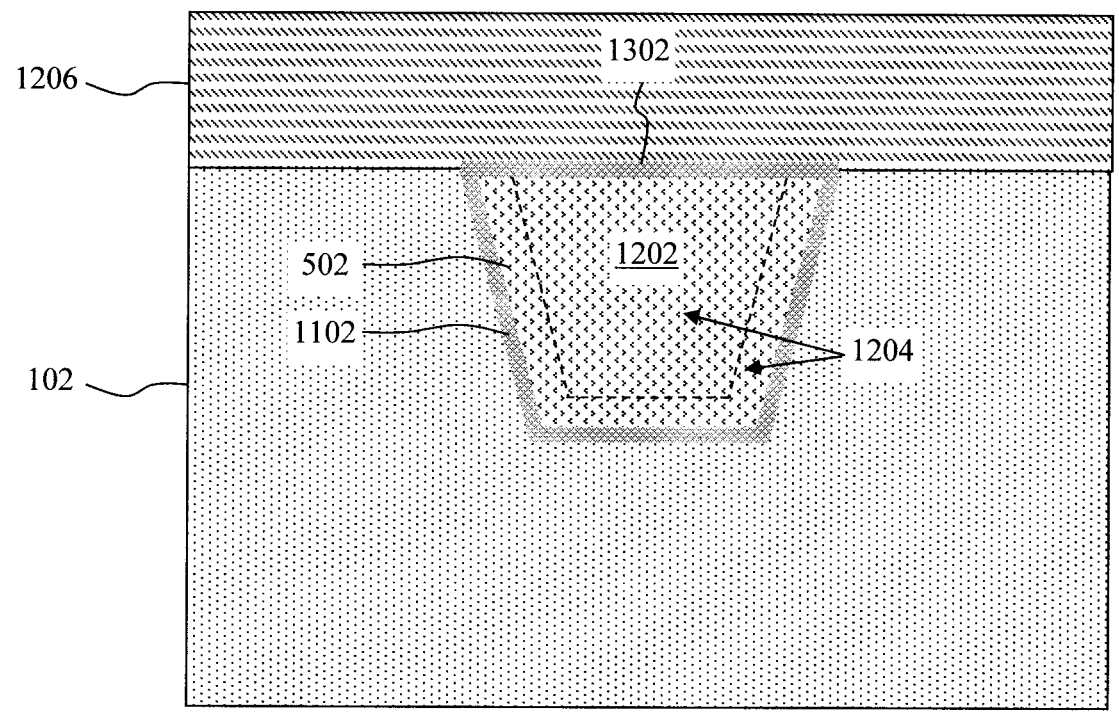
FIG. 13 is a cross-sectional diagram illustrating the interconnect and graphene layers having been annealed under conditions sufficient to diffuse carbon from the graphene layers to form a graphene layer at the interface between the interconnect and second dielectric according to an embodiment of the present invention.

As shown in FIG. 13, the result is a (e.g., Co and/or Ru) interconnect 1204 embedded in dielectrics 102 and 1206. A wrap-all-around graphene barrier layer (i.e., graphene layers 1102 and 1302) surrounds the interconnect.

According to an exemplary embodiment, graphene layers 1102 and 1302 each includes from about 1 monolayer (i.e., a single monolayer) to about 5 monolayers of graphene. By way of example only, the annealing conditions include, but are not limited to, a temperature of less than about 600° C., e.g., from about 25° C. to about 260° C. and ranges therebetween, and a duration of from about 1 minute to about 30 minutes and ranges therebetween.

Figure 12:
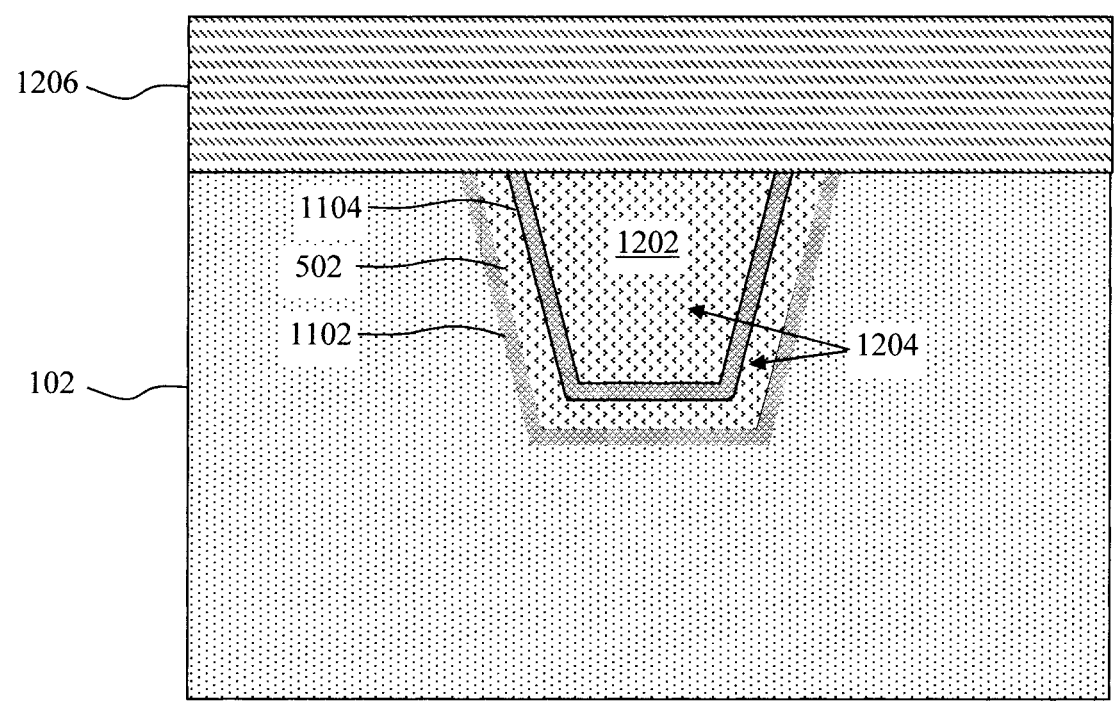
FIG. 12 is a cross-sectional diagram illustrating a fill metal having been deposited over the metal liner and filling the trench to form an interconnect in the trench, followed by a polishing process to remove the overburden, and a second dielectric having been deposited onto the (first) dielectric covering the graphene layers/interconnect according to an embodiment of the present invention.
Figure 14:
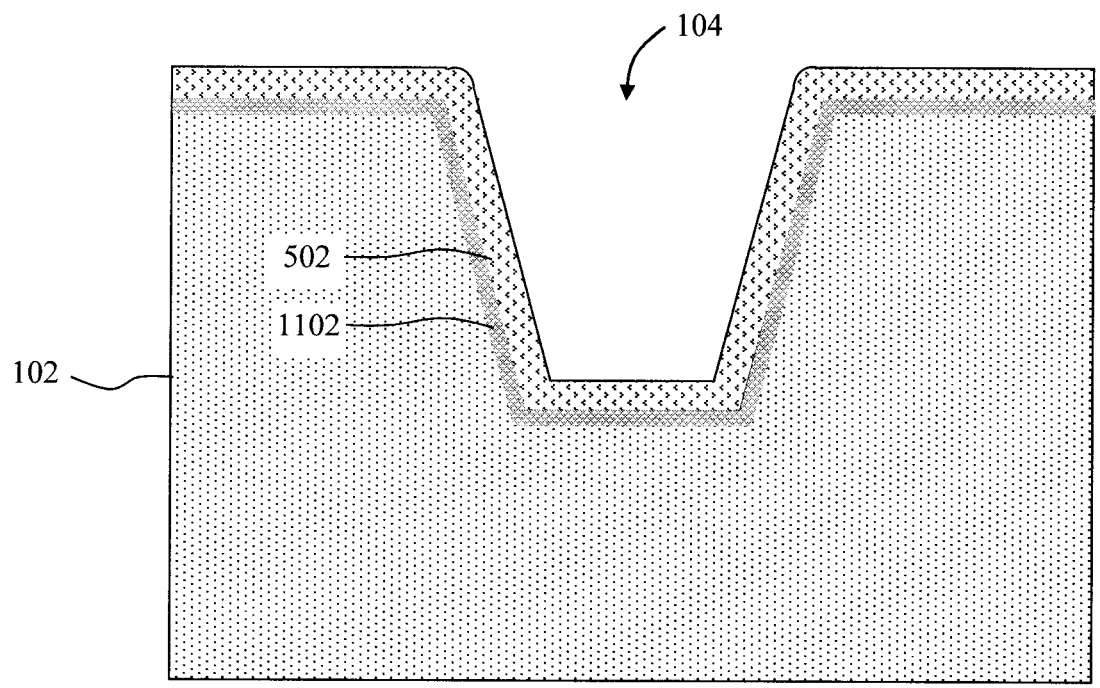
FIG. 14 is a cross-sectional diagram which follows from FIG. 7 illustrating, according to an alternative embodiment, the graphene layer on top of metal liner having been removed according to an embodiment of the present invention.

In a variation to the process flow of FIG. 11-13, a surface carbon burn out is performed to remove the graphene layer above the metal liner, and a separate graphene growth step is employed to form the barrier layer on top of the interconnect. See, for example, FIGS. 14-17. This alternative process flow begins in the same manner as described in accordance with the description of FIG. 11 above, with the patterning of at least one trench 104 in the dielectric 102, depositing a conformal metal liner 502 (e.g., Co and/or Ru) into and lining the trench 104, and forming a graphene layer at the dielectric 102/metal liner 502 interface. As such, what is shown in FIG. 14 follows from FIG. 7, and like structures are numbered alike in the drawings.

Using the embodiment depicted in FIG. 11 as an example, direct growth of graphene on the metal liner 502 can be employed to concurrently form the graphene layer 1102 at the dielectric 102/metal liner 502 interface. Namely, as described above and in Lo, direct graphene growth by PECVD on a metal layer can be used to form graphene layers both on top of the metal layer and below the metal layer at the metal-dielectric interface.

Here, however, the next task is to remove the graphene layer that is on top of the metal liner 502. See FIG. 14. Namely, comparing FIG. 11 to FIG. 14, it can be seen that the graphene layer 1104 on top of metal liner 502 has been removed. According to an exemplary embodiment, graphene layer 1104 is removed using a surface carbon burn out process. Namely, the carbon in graphene layer 1104 can react with oxygen, hydrogen and/or fluorine in plasma or thermal reaction to form a volatile gas, such as $CO_2$, $CH_4$ and $CxFy$, that is removed. This reaction can occur at a wide range of temperatures and thermal reaction will occur at temperatures such as 200° C. and above. By this process, the graphene layer 1104 is removed from the structure in the form of a gas. The graphene layer 1102, which is buried beneath the metal liner 502, is unaffected by this surface burn out procedure.

Figure 15:
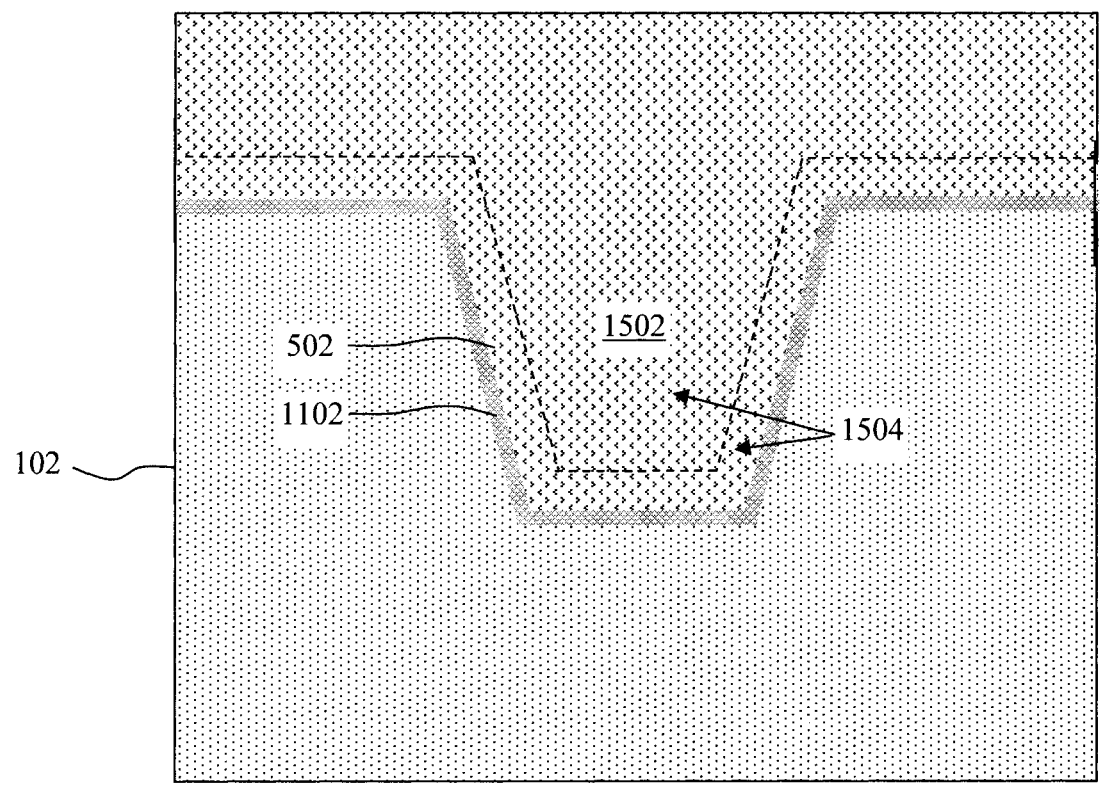
FIG. 15 is a cross-sectional diagram illustrating a fill metal having been deposited onto the metal liner and filling the trench, to form an interconnect in the trench according to an embodiment of the present invention.

Next, as shown in FIG. 15, a fill metal 1502 is deposited (e.g., using PVD, CVD, plating, evaporation, sputtering, etc.) onto the metal liner 502 and filling the trench 104. Along with metal liner 502, this fill metal 1502 forms an interconnect 1504 embedded in the dielectric 102. As provided above, the same metal as metal liner 502 can be used for the fill metal 1502, e.g., both metal liner 502 and fill metal 1502 are Co or Ru. As such, dotted lines are used in FIG. 15 to distinguish the metal liner 502 from the fill metal 1502. However, this is not a requirement, and embodiments are contemplated herein where the metal liner 502 and the fill metal 1502 are different metals and/or different combinations of metals. For instance, by way of example only, the metal liner 502 can be formed from Co, while the fill metal 1502 is Ru, and vice versa.

Figure 16:
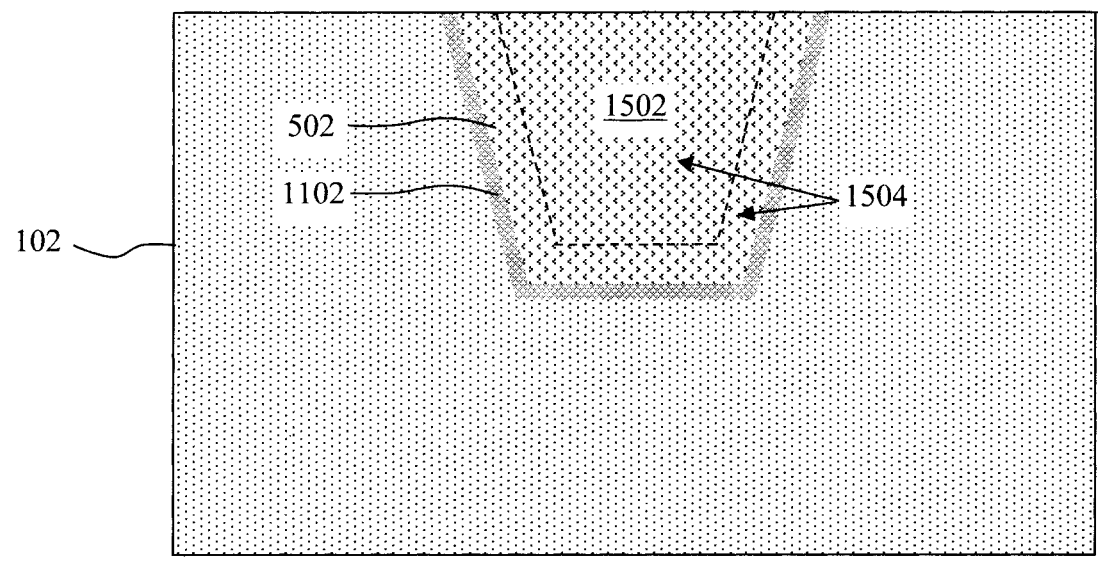
FIG. 16 is a cross-sectional diagram illustrating the fill metal having been polished to remove the overburden according to an embodiment of the present invention.

The fill metal 1502 is then polished using a process such as CMP to remove the overburden. See FIG. 16. As shown in FIG. 16, this polishing step also serves to remove the metal liner 502 and graphene layer 1102 from the top surface of dielectric 102, providing a flat, planar surface for further processing.

A graphene layer 1702 is then deposited on top of the interconnect 1504. See FIG. 17. As described in U.S. Patent Application Publication Number 2011/0303899, graphene can be grown on a metallic layer (e.g., Co) using a CVD-based process and a carbon precursor such as acetylene. According to an exemplary embodiment, graphene layers 1102 and 1702 each includes from about 1 monolayer (i.e., a single monolayer) to about 5 monolayers of graphene.

Finally, a second dielectric 1704 (where dielectric 102 is the first dielectric) is deposited onto the dielectric 102 covering the interconnect 1504/graphene layer 1702. As provided above, suitable dielectrics 1704 include, but are not limited to, oxide materials such as SiOx and/or SiCOH and/or ultralow-κ interlayer dielectric materials such as pSiCOH.

Figure 17:
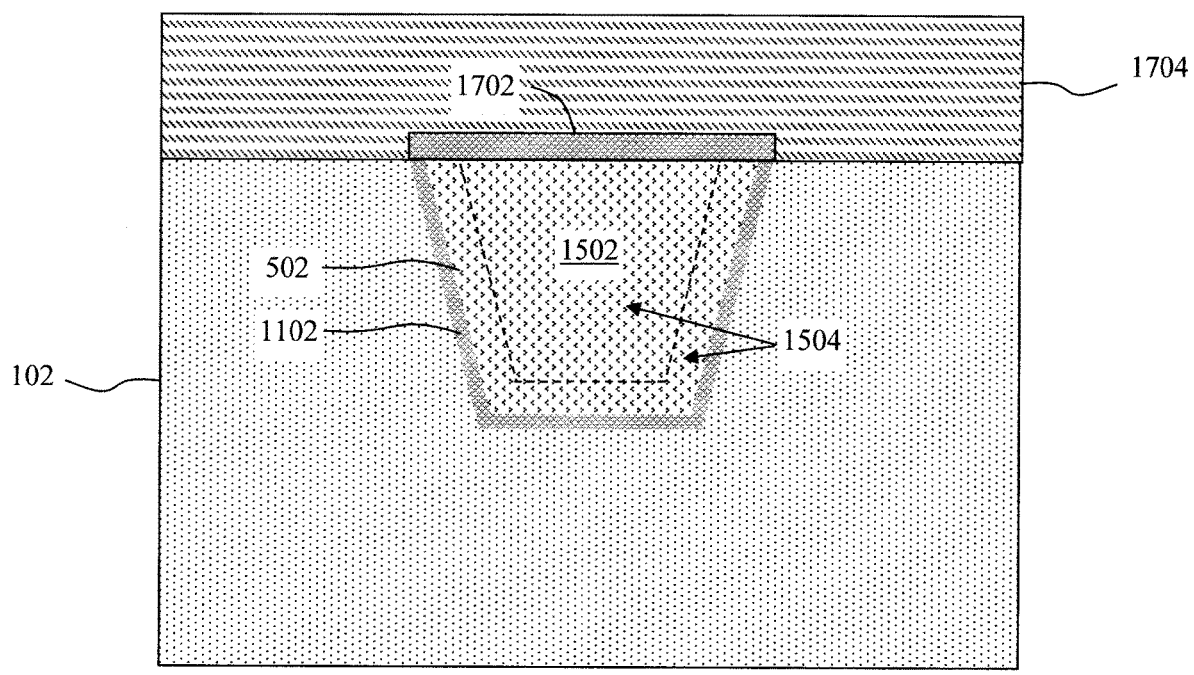
FIG. 17 is a cross-sectional diagram illustrating graphene layer having been deposited on top of the interconnect, and a second dielectric having been deposited onto the (first) dielectric covering the interconnect/graphene layer according to an embodiment of the present invention.

As shown in FIG. 17, the result is a (e.g., Co and/or Ru) interconnect 1504 embedded in dielectrics 102 and 1704. A wrap-all-around graphene barrier layer (i.e., graphene layers 1102 and 1702) surrounds the interconnect.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an interconnect structure, the method comprising the steps of:
    patterning at least one trench in a dielectric;
    forming an interconnect in the at least one trench embedded in the dielectric; and
    forming a wrap-all-around graphene barrier surrounding the interconnect, wherein the step of forming the wrap-all-around graphene barrier surrounding the interconnect further comprises the steps of:
    depositing a graphene layer on top of the interconnect; and
    annealing the interconnect and the graphene layer under conditions sufficient to diffuse carbon atoms from the graphene layer to form a buried graphene layer at an interface between the dielectric and the interconnect, wherein the graphene layer and the buried graphene layer form the wrap-all-around graphene barrier layer surrounding the interconnect.

2. The method of claim 1, wherein the conditions comprise a temperature of from about 25° C. to about 260° C. and ranges therebetween, and a duration of from about 1 minute to about 30 minutes and ranges therebetween.

3. The method of claim 1, wherein the step of forming the wrap-all-around graphene barrier surrounding the interconnect further comprises the step of:
    concurrently forming a graphene layer on top of the interconnect and a buried graphene layer at an interface between the dielectric and the interconnect, wherein the graphene layer and the buried graphene layer form the wrap-all-around graphene barrier layer surrounding the interconnect.

4. The method of claim 1, wherein the dielectric comprises a material selected from the group consisting of: silicon oxide (SiOx), organosilicate glass (SiCOH), porous organosilicate glass (pSiCOH), and combinations thereof.

5. The method of claim 1, wherein the step of forming the interconnect in the at least one trench comprises the step of:
    depositing a metal into and filling the at least one trench, wherein the metal is selected from the group consisting of: cobalt (Co), ruthenium (Ru) and combinations thereof.

6. The method of claim 1, wherein the graphene layer and the buried graphene layer each comprises from about 1 monolayer to about 5 monolayers of graphene.

7. A method of forming an interconnect structure, the method comprising the steps of:
    patterning at least one trench in a dielectric;
    depositing a metal liner into and lining the at least one trench;
    depositing a conformal carbon layer onto the metal liner;
    depositing a fill metal into the at least one trench over the metal liner, wherein the metal liner and the fill metal form an interconnect in the at least one trench embedded in the dielectric;
    depositing a second dielectric over the interconnect; and
    annealing the interconnect and the conformal carbon layer under conditions sufficient to diffuse carbon atoms from the conformal carbon layer to form graphene layers at an interface between the dielectric and the interconnect, and at an interface between the second dielectric and the interconnect, wherein the graphene layers form a wrap-all-around graphene barrier layer surrounding the interconnect.

8. The method of claim 7, wherein the metal liner comprises a metal selected from the group consisting of: Co, Ru and combinations thereof.

9. The method of claim 7, wherein the fill metal comprises a same metal as the metal liner.

* * * * *